(12) United States Patent  
Itagaki

(10) Patent No.: US 9,000,552 B2  
(45) Date of Patent: Apr. 7, 2015

(54) SEMICONDUCTOR INTEGRATED CIRCUIT DEVICE HAVING ANALOG CIRCUIT SEPARATED FROM DIGITAL CIRCUIT USING RESISTIVE AND CAPACITIVE ELEMENT REGIONS

(75) Inventor: Takatoshi Itagaki, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 247 days.

(21) Appl. No.: 13/129,484

(22) PCT Filed: Oct. 30, 2009

(86) PCT No.: PCT/JP2009/068676  
§ 371 (c)(1),  
(2), (4) Date: May 16, 2011

(87) PCT Pub. No.: WO2010/058694  
PCT Pub. Date: May 27, 2010

(65) Prior Publication Data  
US 2011/0254131 A1 Oct. 20, 2011

(30) Foreign Application Priority Data  
Nov. 19, 2008 (JP) ................................. 2008-295743

(51) Int. Cl.  
H01L 21/70 (2006.01)  
H01L 21/02 (2006.01)  
H01L 29/00 (2006.01)  
H01L 27/02 (2006.01)  
H02J 7/00 (2006.01)  
G01R 31/36 (2006.01)

(52) U.S. Cl.  
CPC ................................. *H01L 27/0203* (2013.01)

(58) Field of Classification Search  
None  
See application file for complete search history.

(56) References Cited

U.S. PATENT DOCUMENTS

| | | | |
|---|---|---|---|
| 6,057,588 A * | 5/2000 | Yamazaki | 257/506 |
| 2001/0028096 A1 | 10/2001 | Ohguro et al. | |
| 2002/0079556 A1 | 6/2002 | Ishikura et al. | |
| 2003/0178665 A1* | 9/2003 | Takenaka | 257/306 |
| 2004/0089901 A1 | 5/2004 | Ohkubo et al. | |
| 2005/0098851 A1* | 5/2005 | Nakayama et al. | 257/528 |
| 2005/0156277 A1* | 7/2005 | Nakano et al. | 257/532 |

(Continued)

FOREIGN PATENT DOCUMENTS

| | | |
|---|---|---|
| JP | 01-220467 | 9/1989 |
| JP | 07-235616 | 9/1995 |

(Continued)

OTHER PUBLICATIONS

International Search Report mailed on Dec. 1, 2009.

(Continued)

*Primary Examiner* — Michael Jung  
(74) *Attorney, Agent, or Firm* — IPUSA, PLLC

(57) ABSTRACT

In a semiconductor integrated circuit device including a digital circuit region in which a digital circuit is formed, and an analog circuit region in which an analog circuit is formed, the analog circuit region is separated into an active element region in which an active element of the analog circuit is formed, and a resistive and capacitive element region in which a resistor or a capacitor of the analog circuit is formed, the resistive and capacitive element region is arranged in a region adjacent to the digital circuit region, and the active element region is arranged in a region separated from the digital circuit region.

5 Claims, 9 Drawing Sheets

(56) References Cited

U.S. PATENT DOCUMENTS

| | | | |
|---|---|---|---|
| 2007/0090412 A1* | 4/2007 | Uchida | 257/239 |
| 2007/0188369 A1 | 8/2007 | Itagaki | |
| 2008/0048294 A1* | 2/2008 | Yamamoto | 257/536 |
| 2008/0265300 A1* | 10/2008 | Akiyama et al. | 257/311 |
| 2009/0315625 A1* | 12/2009 | Zolfaghari | 330/301 |

FOREIGN PATENT DOCUMENTS

| | | |
|---|---|---|
| JP | 2000-101021 | 4/2000 |
| JP | 2001-345428 | 12/2001 |
| JP | 2002-190516 | 7/2002 |
| JP | 2004-153175 | 5/2004 |
| JP | 2007-096170 | 4/2007 |
| JP | 2007-251139 | 9/2007 |

OTHER PUBLICATIONS

Japanese Office Action dated Jan. 22, 2013.

* cited by examiner

SEMICONDUCTOR INTEGRATED CIRCUIT DEVICE HAVING ANALOG CIRCUIT SEPARATED FROM DIGITAL CIRCUIT USING RESISTIVE AND CAPACITIVE ELEMENT REGIONS

TECHNICAL FIELD

The present invention generally relates to semiconductor integrated circuit devices, and more particularly to a semiconductor integrated circuit device including a digital circuit and an analog circuit.

BACKGROUND ART

Recently, battery packs including lithium-ion batteries are used in portable equipments, such as digital cameras. In general, it is regarded difficult to detect a remaining battery capacity from a voltage of the lithium-ion battery. For this reason, the remaining battery capacity is measured by detecting a charge or discharge current of the battery by a microcomputer, for example, and totaling the detected charge or discharge current.

A fuel gauge IC (Integrated Circuit) for measuring the remaining battery capacity in the above described manner may include an analog circuit such as a high-precision A/D (Analog-to-Digital) converter, and a digital circuit such as a CPU (Central Processing Unit) to total the measured current values and a timer, that are provided in a 1-chip semiconductor integrated circuit device.

Among the circuits provided in the 1-chip semiconductor integrated circuit device, noise caused by charging or discharging, flow-through current, and harmonics may be generated in the digital circuit in synchronism with a clock. The noise generated within the digital circuit propagates to a semiconductor substrate within the chip, and enters the analog circuit that is formed by the high-precision A/D converter and the like, to deteriorate the precision of the A/D conversion.

On the other hand, there are demands to reduce the chip size of the fuel gauge IC due to the reduced size of recent battery packs. But due to the small chip size of the fuel gauge IC, the effects of the noise have become even greater, and it has become difficult to provide circuits and electronic parts for the noise countermeasures. Such a trend is not limited to the fuel gauge IC, but is a common problem to be solved in semiconductor devices in which the analog circuit and the digital circuit coexist.

FIG. 1 is a plan view of a layout structure of an example of a conventional semiconductor integrated circuit device. In FIG. 1, a semiconductor integrated circuit device 1 includes an analog circuit region 2 and a digital circuit region 3 that are separated. The analog circuit region 2 and the digital circuit region 3 are separated by a distance D1.

The analog circuit region 2 includes a region 2a in which a delta-sigma modulator is formed, a region 2b in which an oscillator circuit including a PLL (Phase Locked Loop) is formed, a region 2c in which a sensor is formed, and the like. The analog circuit region 2 is segmented into regions for each function of the circuit or element.

In order to suppress mixing of noise from the digital circuit to the analog circuit, a first well and a second well are independently formed on a surface of the semiconductor substrate. The digital circuit is formed within the first well, and the analog circuit is formed within the second well, such that the resistivity of the semiconductor substrate is 1000 times that of the first well or higher. Such a structure is proposed in a Patent Document 1. In addition, a Patent Document 2 proposes a structure in which a digital circuit region and an analog circuit region are provided on a silicon substrate, and a guard ring region is provided in a ring-shape to surround an outer peripheral part of the digital circuit region.

PRIOR ART DOCUMENTS

Patent Documents

Patent Document 1: Japanese Laid-Open Patent Publication No. 2001-345428
Patent Document 2: Japanese Laid-Open Patent Publication No. 2007-96170

DISCLOSURE OF THE INVENTION

Problems to be Solved by the Invention

In the conventional semiconductor integrated circuit device illustrated in FIG. 1, the distance D1 must be set long in order to suppress the mixing of the noise from the digital circuit region 3 to the analog circuit region 2 via the semiconductor substrate. As a result, there was a problem in that the chip area of the semiconductor integrated circuit device increases considerably by an amount corresponding to the distance D1 that must be set long.

The technique proposed in the Patent Document 1 requires a special process to make the resistivity that is 1000 times the first well or higher, by forming a low-resistance well in a high-resistance silicon substrate. Hence, the use of the general process may not effectively suppress the mixing of the noise from the digital circuit to the analog circuit. In addition, the technique proposed in the Patent Document 2 may not arrange an active element, a resistor, a capacitor, and the like in an area in which the guard ring is provided, and there was a problem in that the chip size increases considerably by an amount corresponding to the area required to provide the guard ring.

One aspect of the present invention is to provide a semiconductor integrated circuit device that may set a separation distance between a digital circuit region and an analog circuit region to a relatively short distance, and suppress the chip area from increasing considerably.

Means of Solving the Problems

According to one aspect of the present invention, there is provided a semiconductor integrated circuit device including a semiconductor substrate, a digital circuit formed on the semiconductor substrate, and an analog circuit formed on the semiconductor substrate, wherein a surface of the semiconductor substrate is separated into a digital circuit region in which the digital circuit is formed, and an analog circuit region in which the analog circuit is formed, the analog circuit region is separated into an active element region in which an active element of the analog circuit is formed, and a resistive and capacitive element region in which a resistor or a capacitor of the analog circuit is formed, the resistive and capacitive element region is arranged in a region adjacent to the digital circuit region, and the active element region is arranged in a region separated from the digital circuit region.

Effects of the Invention

According to the present invention, a separation distance between a digital circuit region and an analog circuit region may be set relatively short, and the chip area may be prevented from increasing considerably.

MODE OF CARRYING OUT THE INVENTION

A description will be given of each of embodiments of the present invention, by referring to FIG. 2 and subsequent figures.

Embodiments

Semiconductor Integrated Circuit Device in One Embodiment

Figure 1:
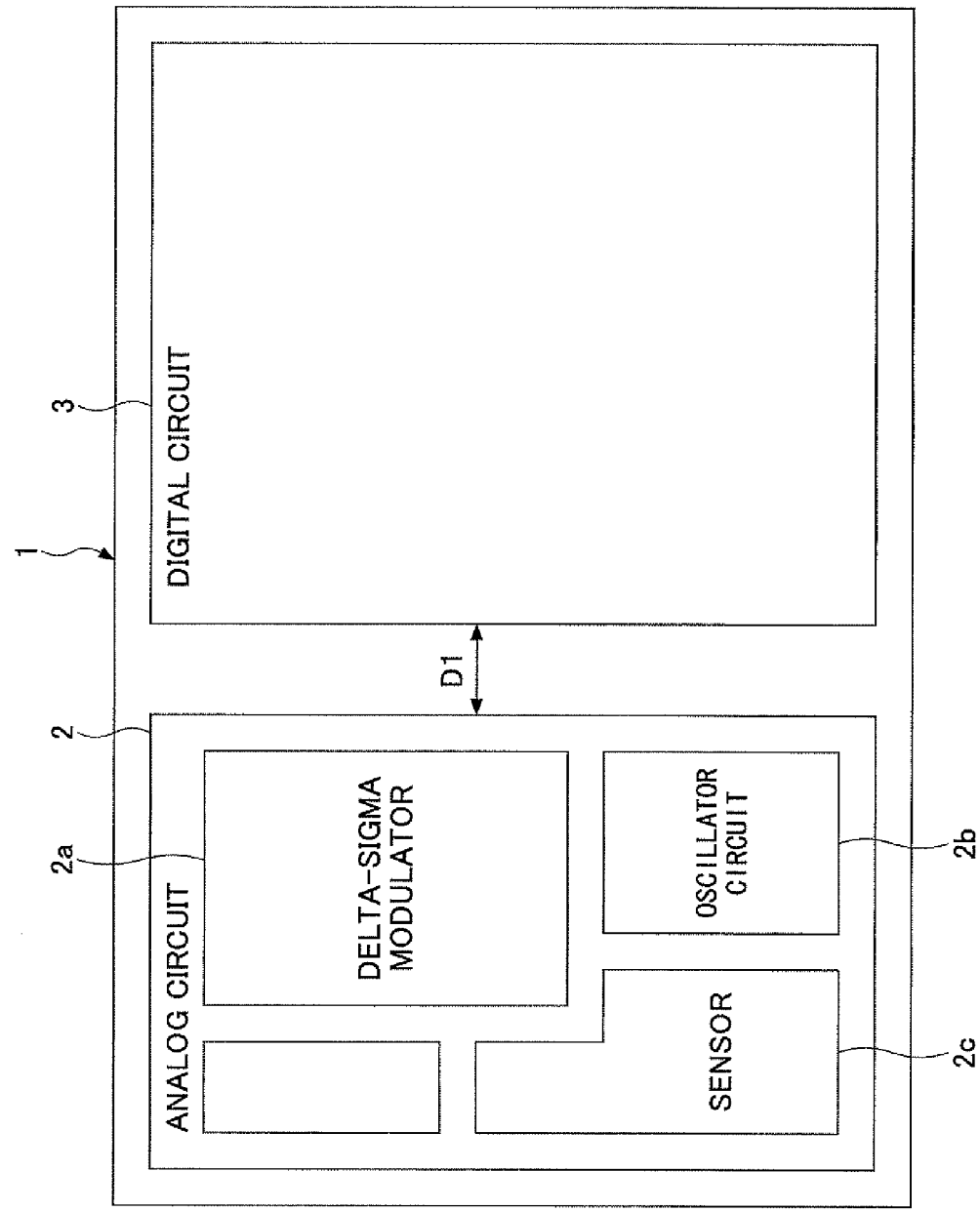
FIG. 1 is a plan view of a layout structure of an example of a conventional semiconductor integrated circuit device.
Figure 2:
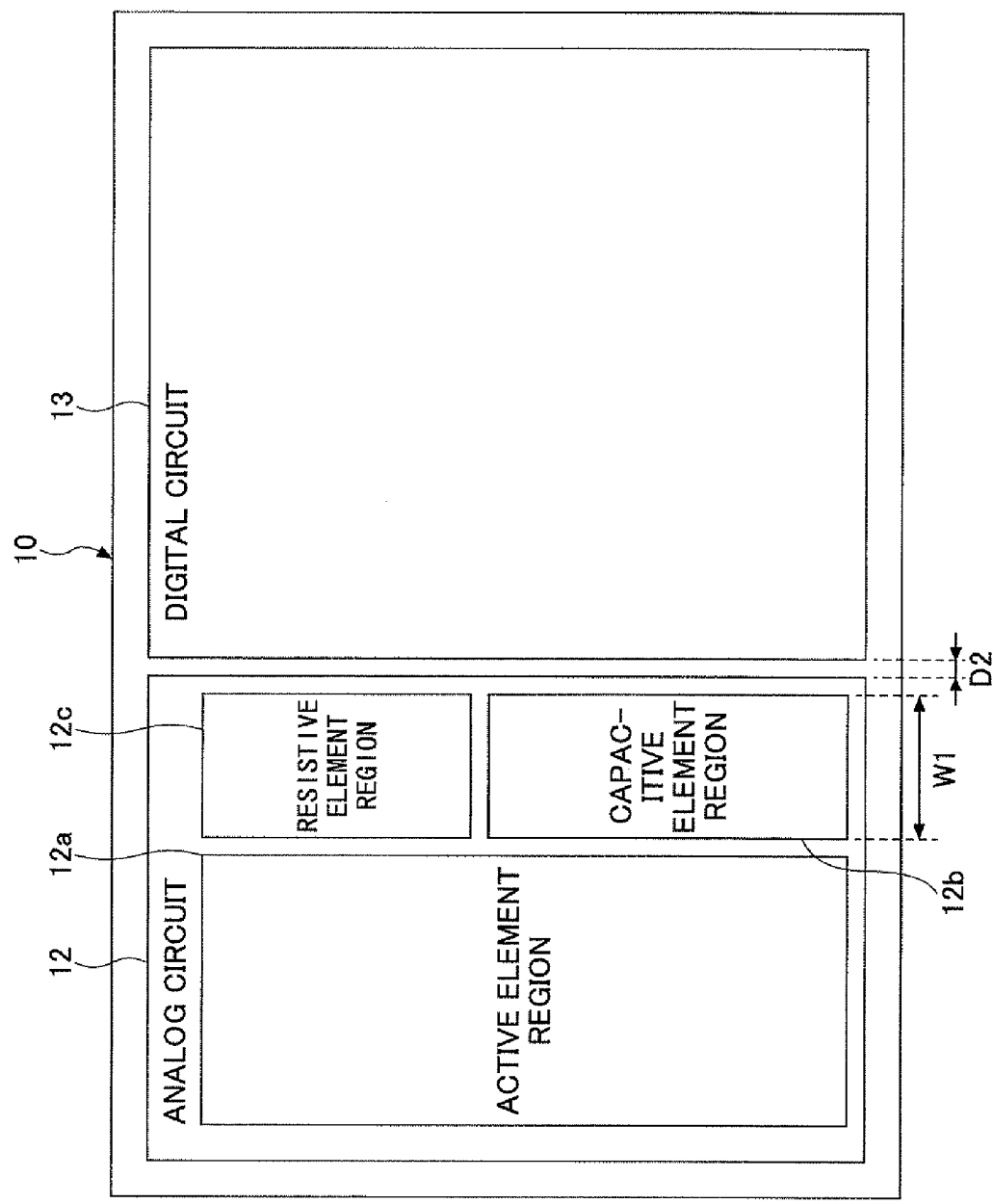
FIG. 2 is a plan view of a layout structure of an example of a semiconductor integrated circuit device in one embodiment of the present invention.

FIG. 2 is a plan view of a layout structure of an example of a semiconductor integrated circuit device in one embodiment of the present invention. In FIG. 2, a semiconductor integrated circuit device 10 includes an analog circuit region 12 and a digital circuit region 13 that are separated. The analog circuit region 12 and the digital circuit region 13 are separated by a distance D2 (D2<D1).

In a case in which the semiconductor integrated circuit device 10 forms a fuel gauge IC, a delta-sigma modulator, an oscillation circuit including a PLL, various sensors, and the like may be formed in the analog circuit region 12. In addition, a CPU, a memory such as a RAM (Random Access memory), a ROM (Read Only Memory) and the like, a register, a communication unit or circuit, and the like may be formed in the digital circuit region 13.

The analog circuit region 12 is separated into an active element region 12a in which active elements such as a MOS (Metal Oxide Semiconductor) transistor and the like are formed, a capacitive element region 12b in which a capacitor is formed, and a resistive element region 12c in which a resistor is formed. A capacitive and resistive element region in which a capacitive element and a resistive element coexist may be provided.

The MOS transistors forming the delta-sigma modulator, the PLL, and the various sensors of the analog circuit are formed in the active element region 12a. Particularly the capacitors having a relatively large capacitance and forming the delta-sigma modulator and the PLL may be formed in the capacitive element region 12b. Particularly the resistors having a relatively large resistance and forming the delta-sigma modulator and the PLL may be formed in the resistive element region 12c.

The capacitive element region 12b and the resistive element region 12c are formed in regions of the analog circuit region 12 concentrated at locations adjacent to the digital circuit region 13. In addition, the active element region 12a is formed in the region of the analog circuit region 12 concentrated at a location separated from the digital circuit region 13.

Figure 3:
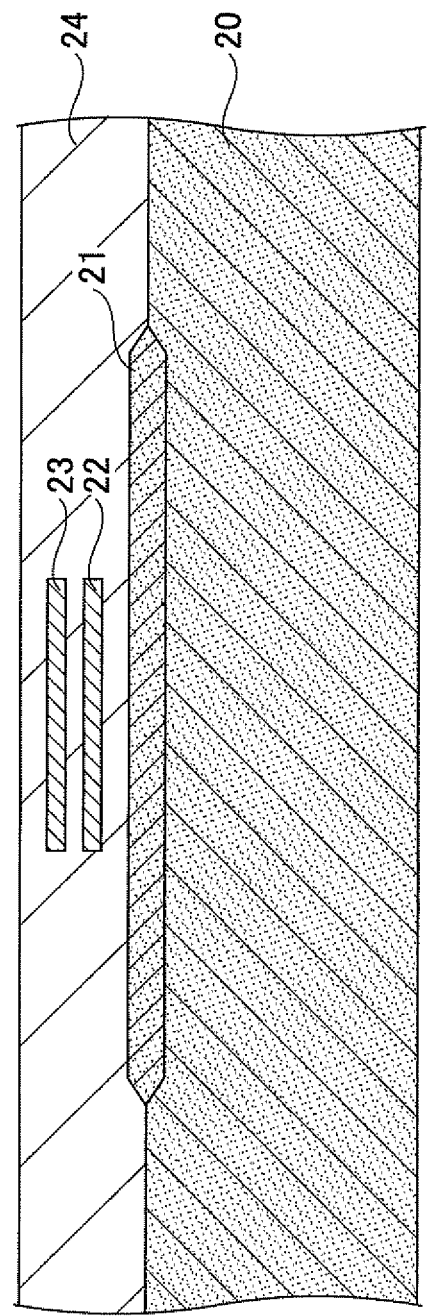
FIG. 3 is a cross sectional view of a structure of an example of a capacitive element region.

FIG. 3 is a cross sectional view of a structure of an example of the capacitive element region 12b. In FIG. 3, an element isolation layer 21 called LOCOS (LOcal Oxidation of SIlicon) is formed on a surface of a semiconductor substrate 20. A first level metal wiring layer 22 and a second level metal wiring layer 23 are formed on the element isolation layer 21 via an insulator layer 24 that is formed by an oxide layer or the like, in a state separated from and opposing each other. The first level metal wiring layer 22 and the second level metal wiring layer 23 form a capacitor. Of course, polysilicon wiring layer or the like may be used in place of the metal wiring layers 22 and 23.

Figure 4:
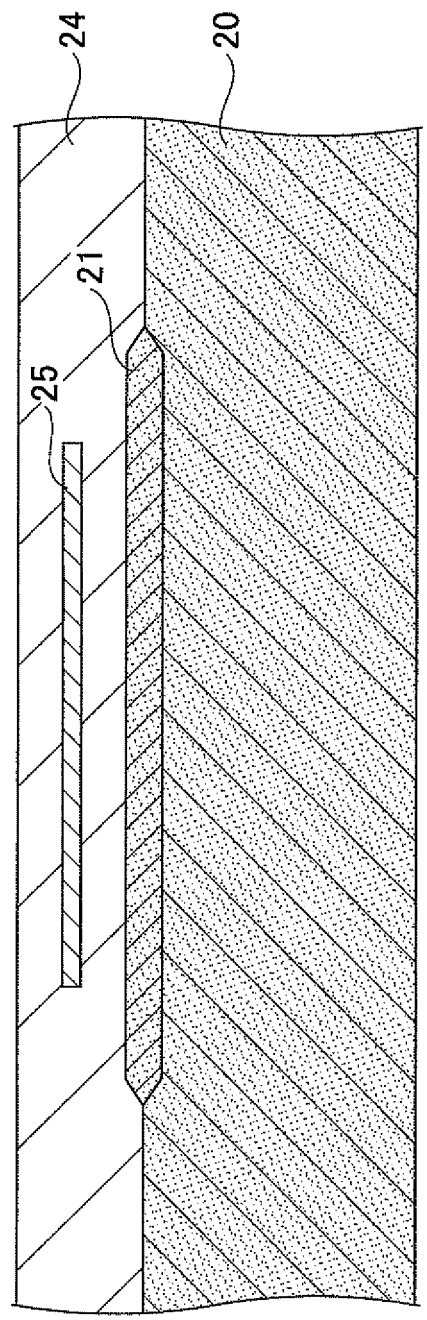
FIG. 4 is a cross sectional view of a structure of an example of a resistive element region.

FIG. 4 is a cross sectional view of a structure of an example of the resistive element region 12c. In FIG. 4, the element isolation layer 21 called the LOCOS is formed on the surface of the semiconductor substrate 20. A polysilicon wiring layer 25 is formed on the element isolation layer 21 via the insulator layer 24 that is formed by the oxide layer or the like. A wiring resistance of this polysilicon wiring layer 25 is used as a resistor element.

Figure 5:
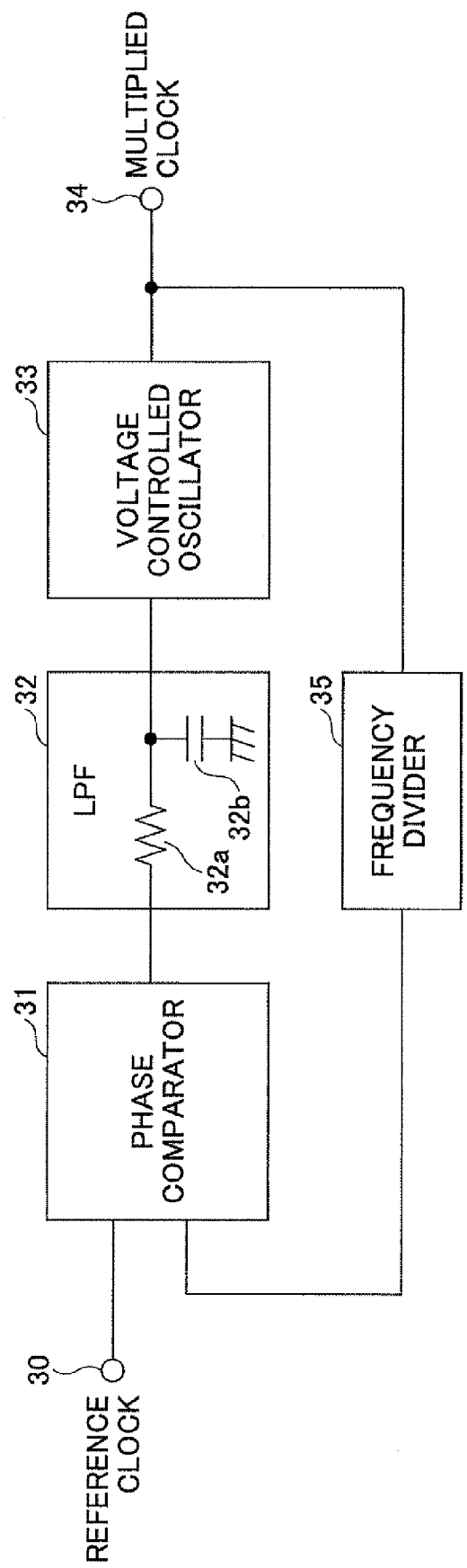
FIG. 5 is a block diagram of an example of a PLL.

FIG. 5 is a block diagram of an example of the PLL. In FIG. 5, a reference clock generated from an oscillator (not illustrated) is supplied to a terminal 30 and supplied to a phase comparator 31. The phase comparator 31 performs a phase comparison between the reference clock and a frequency divided clock that is supplied from a frequency divider 35, in order to output a phase error signal.

The phase error signal is supplied to a LPF (Low-Pass Filter) 32 in which unwanted frequency components are eliminated, and thereafter supplied to a VCO (Voltage Controlled Oscillator) 33. Because a cutoff frequency of the LPF 32 is relatively low, a resistor 32a forming the LPF 32 has a relatively large resistance, and a capacitor 32b forming the LPF 32 has a relatively large capacitance.

An oscillation frequency of the VCO 33 is variably controlled depending on the phase error signal. An oscillation frequency signal output from the VCO 33 is output from a terminal 34 as a multiplied clock, and is also supplied to the frequency divider 35. The frequency divider 35 frequency-divides the multiplied clock, and supplies the frequency divided clock to the phase comparator 31.

The phase comparator 31, the VCO 33, and the frequency divider 35 are formed in the active element region 12a of the analog circuit region 12. The resistor 32a and the capacitor 32b of the LPF 32 are formed in the resistive element region 12c and the capacitive element region 12b of the analog circuit region 12.

Figure 6:
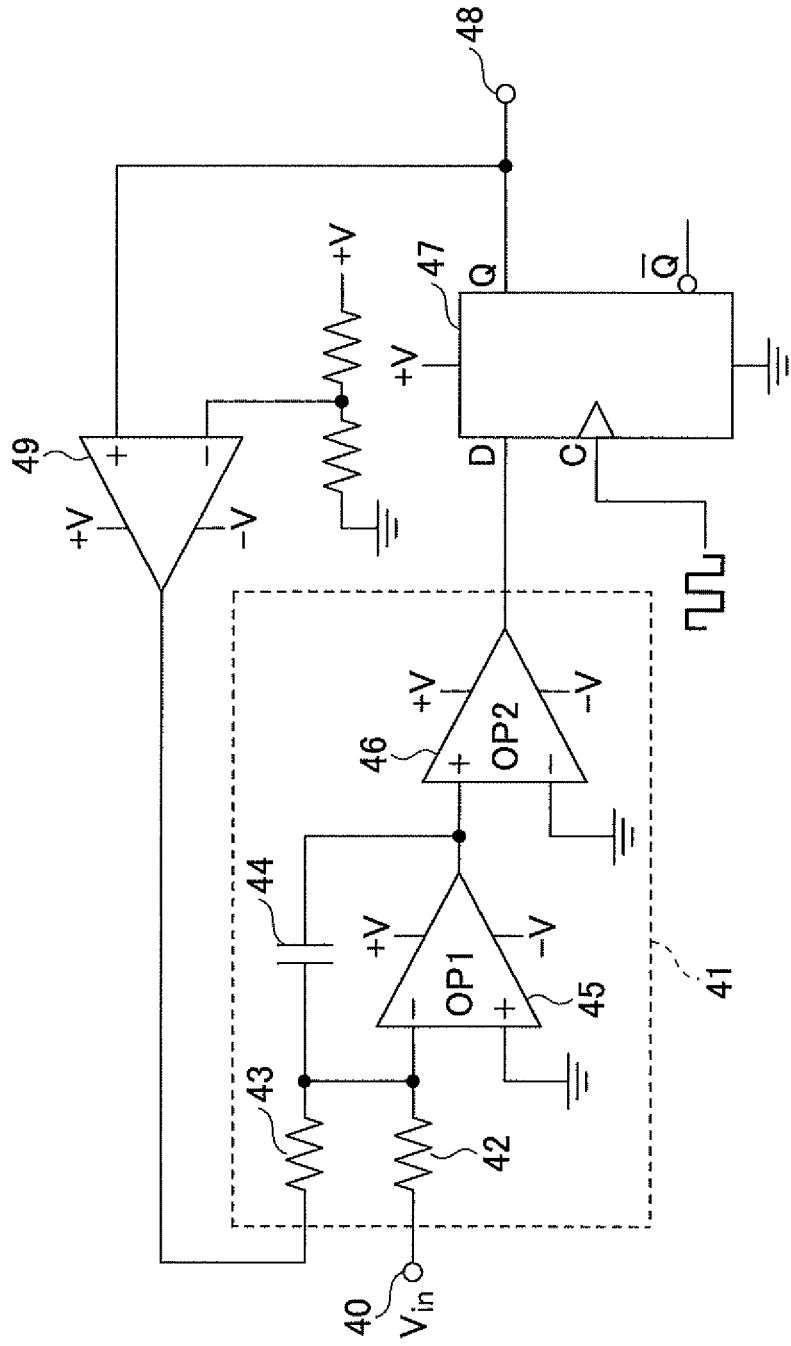
FIG. 6 is a diagram of an example of a delta-sigma modulator.

FIG. 6 is a diagram of an example of the delta-sigma modulator. In FIG. 6, an analog voltage Vin input to a terminal 40 is supplied to an integration circuit 41. The integration circuit 41 includes an input resistor 42, a feedback resistor 43, an integration capacitor 44, and operational amplifiers 45 and 46. The resistors 42 and 43 have relatively large resistances, and the integration capacitor 44 has a relatively large capacitance.

An output signal of the integration circuit 41 is quantized in a delay type (D-type) flip-flop 47 before being output from a terminal 48. In addition, the output signal from the terminal 48 is fed back to the integration circuit 41 via a 1-bit DAC (Digital-to-Analog Converter) 49.

The operational amplifiers 45 and 46, the flip-flop 47, and the DAC 49 are formed in the active element region 12a of the analog circuit region 12. The input resistor 42 and the feedback resistor 43 are formed in the resistive element region 12c of the analog circuit region 12, and the integration capacitor 44 are formed in the capacitive element region 12b of the analog circuit region 12. The operational amplifiers 45 and 46 form an integration circuit, and the input resistor 42 and the integration capacitor 44 occupy a relatively large area on the semiconductor substrate 20.

In this embodiment, even if noise generated in the digital circuit region 13 mixes into the capacitive element region 12b or the resistive element region 12c on the semiconductor substrate 20 that are separated by the distance D2 in FIG. 2, the mixing of the noise into the first level metal wiring layer 22 or the polysilicon wiring layer 25 on the element isolation layer 21 may be suppressed because the element isolation layer 21 is relatively thick and the thickness thereof is several 100 nm, for example.

On the other hand, a width W1 of each of the capacitive element region 12b and the resistive element region 12c located between the active element region 12a and the digital circuit region 13 is 50 μm or greater. For this reason, the noise generated in the digital circuit region 13 and entering the capacitive element region 12b or the resistive element region 12c of the semiconductor substrate 20 may be attenuated in the capacitive element region 12b or the resistive element region 12c having the width W1 on the semiconductor substrate 20. As a result, the mixing of the noise into the active element region 12a of the semiconductor substrate 20 may be suppressed.

A guard band may be provided at a boundary region between the active element region 12a and the capacitive element region 12b or the resistive element region 12c of the analog circuit region 12, and a guard band may be provided at a boundary region between the analog circuit region 12 and the digital circuit region 13.

Figure 7:
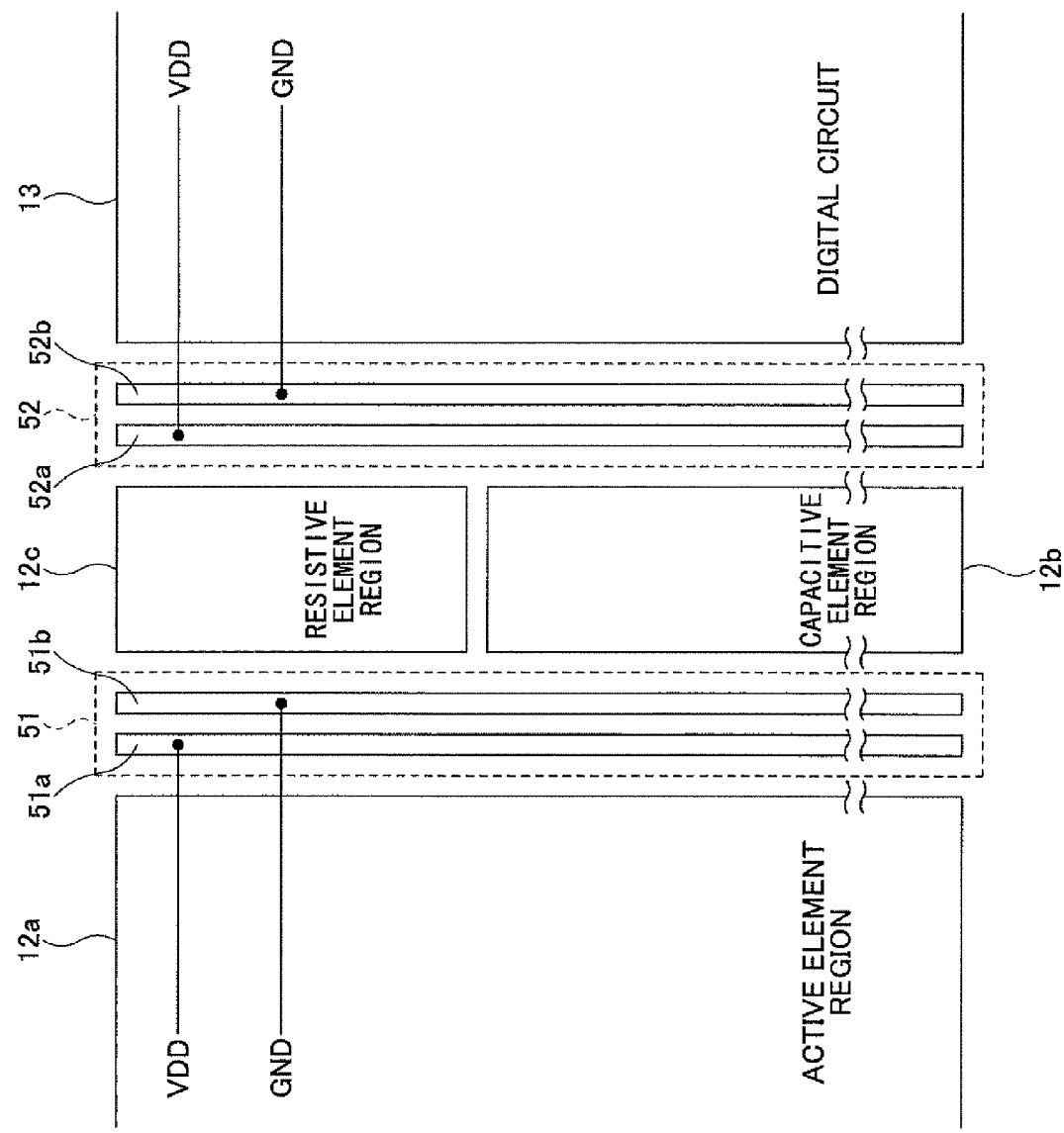
FIG. 7 is a plan view of a layout structure for explaining a guard band.

FIG. 7 is a plan view of a layout structure for explaining the guard band. In FIG. 7, the guard band includes a guard band 51 located on the analog circuit side, and a guard band 52 located on the digital circuit side.

The analog circuit side guard band 51 is provided in the boundary region between the active element region 12a and the capacitive element region 12b or the resistive element region 12c of the analog circuit region 12, and includes substrate contacts 51a and 51b. The digital circuit side guard band 52 is provided in the boundary region between the analog circuit region 12 and the digital circuit region 13, and includes substrate contacts 52a and 52b provided on the semiconductor substrate 20.

The substrate contact 51a is formed by a diffusion region $p^+$ having a high impurity concentration, and connects to a terminal supplied with a power supply voltage VDD of the analog circuit region 12. The substrate contact 51b is formed by a diffusion region $n^+$ having a high impurity concentration, and connects to a terminal supplied with a ground voltage GND of the analog circuit region 12.

The substrate contact 52a is formed by a diffusion region $p^+$ having a high impurity concentration, and connects to a terminal supplied with a power supply voltage VDD of the digital circuit region 13. The substrate contact 52b is formed by a diffusion region $n^+$ having a high impurity concentration, and connects to a terminal supplied with a ground voltage GND of the digital circuit region 13.

The noise generated in the digital circuit region 13 is taken into the substrate contacts 51a and 51b of the analog circuit side guard band 51 or, into the substrate contacts 52a and 52b of the digital circuit side guard band 52. Thus, the noise may be prevented from propagating to the analog circuit region 12. Accordingly, the separation distance between the digital circuit region and the analog circuit region may be set relatively short, and the chip area may be suppressed from increasing considerably.

Only one of the substrate contacts 51a and 51b may be provided. Similarly, only one of the substrate contacts 52a and 52b may be provided.

<Semiconductor Integrated Circuit Device in Another Embodiment>

Figure 8:
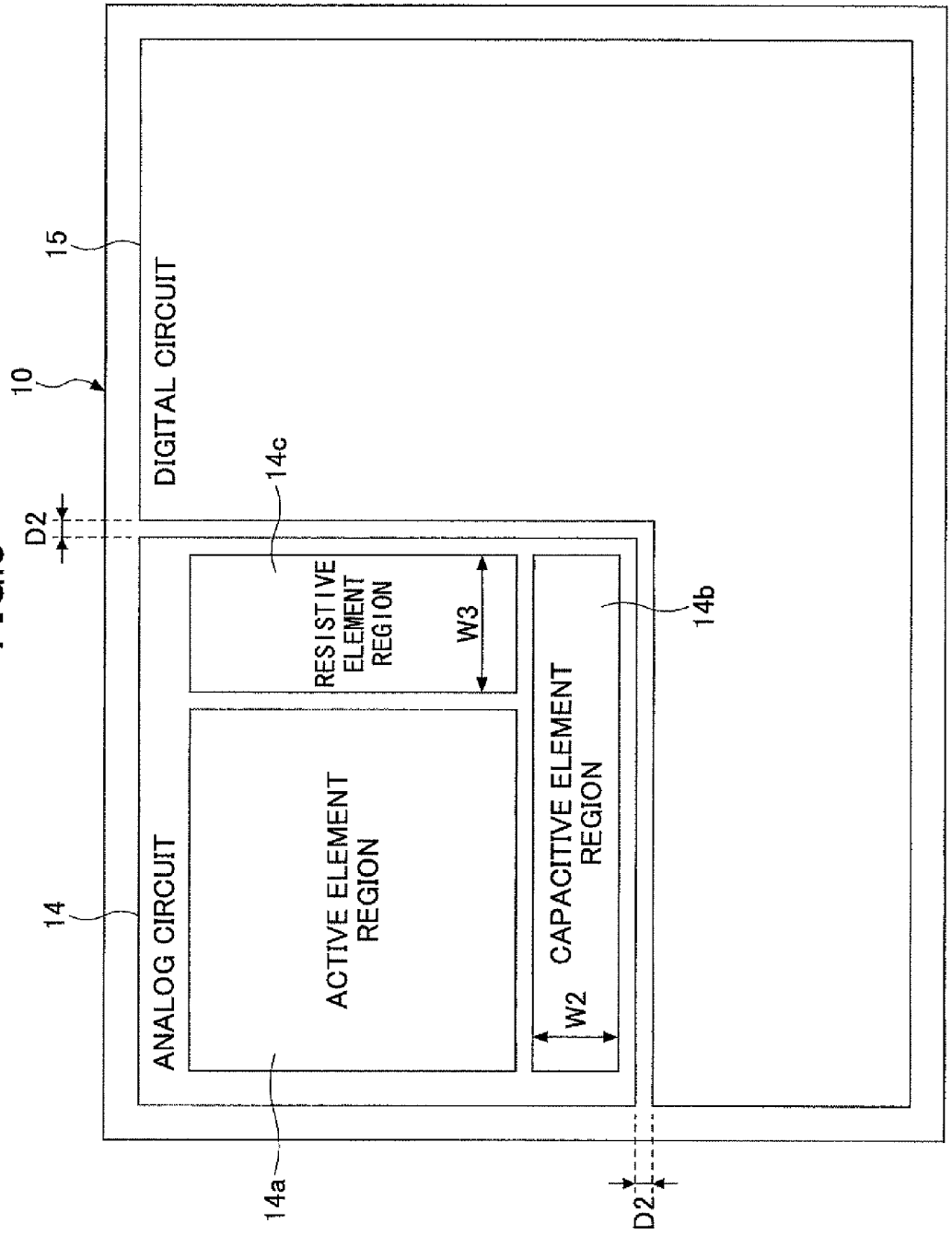
FIG. 8 is a plan view of a layout structure of an example of the semiconductor integrated circuit device in another embodiment of the present invention.

FIG. 8 is a plan view of a layout structure of an example of the semiconductor integrated circuit device in another embodiment of the present invention. In FIG. 8, the semiconductor integrated circuit device 10 includes an analog circuit region 14 and a digital circuit region 15 that are separated. In this example, the analog circuit region 14 has a rectangular shape, and the digital circuit region 15 has an inverted L-shape partially surrounding the analog circuit region 14. The analog circuit region 14 and the digital circuit region 15 are separated by a distance D2 (D2<D1).

In a case in which the semiconductor integrated circuit device 10 forms a fuel gauge IC, a delta-sigma modulator, an oscillation circuit including a PLL, various sensors, and the like may be formed in the analog circuit region 14. In addition, a CPU, a memory such as a RAM, a ROM and the like, a register, a communication unit or circuit, and the like may be formed in the digital circuit region 15.

The analog circuit region 14 is separated into an active element region 14a in which active elements such as a MOS transistor and the like are formed, a capacitive element region 14b in which a capacitor is formed, and a resistive element region 14c in which a resistor is formed. A capacitive and resistive element region in which a capacitive element and a resistive element coexist may be provided.

The MOS transistors forming the delta-sigma modulator, the PLL, and the various sensors of the analog circuit are formed in the active element region 14a. Particularly the capacitors having a relatively large capacitance and forming the delta-sigma modulator and the PLL may be formed in the capacitive element region 14b. Particularly the resistors having a relatively large resistance and forming the delta-sigma modulator and the PLL may be formed in the resistive element region 14c.

The capacitive element region 14b and the resistive element region 14c are formed in regions of the analog circuit region 14 concentrated at locations adjacent to the digital circuit region 15. In addition, the active element region 14a is formed in the region of the analog circuit region 14 concentrated at a location separated from the digital circuit region 15.

In this embodiment, even if noise generated in the digital circuit region 15 mixes into the capacitive element region 14b or the resistive element region 14c on the semiconductor substrate 20 that are separated by the distance D2 in FIG. 8, the mixing of the noise into the first level metal wiring layer 22 or the polysilicon wiring layer 25 on the element isolation layer 21 may be suppressed because the element isolation layer 21 is relatively thick and the thickness thereof is several 100 nm, for example. On the other hand, a width W2 of the capacitive element region 14b located between the active element region 14a and the digital circuit region 15 and a width W3 of the resistive element region 14c located between the active element region 14a and the digital circuit region 15 respectively are 50 μm or greater. For this reason, the noise generated in the digital circuit region 15 and entering the capacitive element region 14b or the resistive element region 14c of the semiconductor substrate 20 may be attenuated in the capacitive element region 14b having the width W2 or the resistive element region 14c having the width W3 on the semiconductor substrate 20. As a result, the mixing of the noise into the active element region 14a of the semiconductor substrate 20 may be suppressed.

<Battery Pack>

Figure 9:
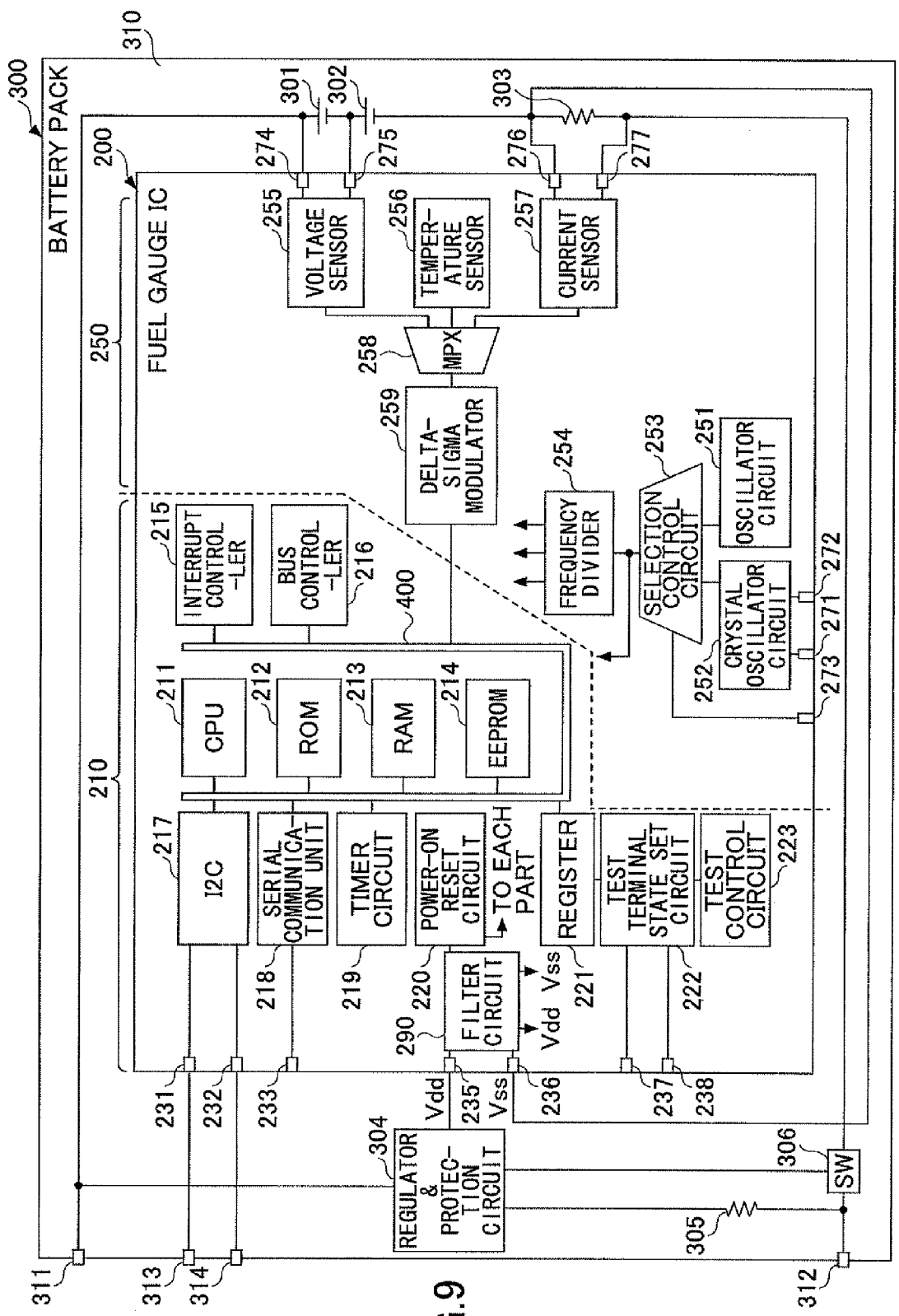
FIG. 9 is a block diagram of an example of a battery pack.

FIG. 9 is a block diagram of an example of a battery pack applied with the fuel gauge IC. In FIG. 9, a fuel gauge IC 200 corresponds to the semiconductor integrated circuit device 10 illustrated in FIG. 2, for example, and includes a digital part 210 and an analog part 250.

The digital part 210 corresponds to the digital circuit region 13 illustrated in FIG. 2, and the analog part 250 corresponds to the analog circuit region 12 illustrated in FIG. 2.

A CPU 211, a ROM 212, a RAM 213, an EEPROM (Electrically Erasable Programmable ROM) 214, an interrupt controller 215, a bus controller 216, an I2C (Inter-Integrated Circuit) 217, a serial communication unit 218, a timer circuit 219, a power-on reset circuit 220, a register 221, a test terminal state set circuit 222, a test control circuit 223, and a filter circuit 290 are provided within the digital part 210. The CPU 211, the ROM 212, the RAM 213, the EEPROM 214, the interrupt controller 215, the bus controller 216, the I2C 217, the serial communication unit 218, the timer circuit 219, and the register 221 are connected via an internal bus 400.

The CPU 211 executes a program stored in the ROM 212 and controls the entire fuel gauge IC 200, and performs processes including computing a remaining battery capacity by totaling a charge or discharge current of batteries 301 and 302. The ROM 213 stores various data, including intermediate data of operations and computations executed by the CPU 211, and may also be used as a work region of the CPU 211. The EEPROM 214 stores trimming information and the like.

Interrupt requests are supplied from various parts of the fuel gauge IC 200 to the interrupt controller 215, and the interrupt controller 215 generates an interrupt depending on priorities of the interrupt requests and notifies the interrupt to the CPU 211. The bus controller 216 controls which circuit part within the fuel gauge IC 200 is to use the internal bus 400.

The I2C 217 performs a two-wire serial communication by being connected to communication lines via ports 231 and 232. The serial communication unit 218 performs a single-wire serial communication by being connected to a communication line that is not illustrated via a port 233.

The timer circuit 219 counts a system block, and the CPU 211 refers to a counted value of this timer circuit 219. The power-on reset circuit 220 detects a rise in a power supply voltage Vdd supplied to a port 235 that is connected to the power-on reset circuit 220 via the filter circuit 290, and generates a reset signal that is supplied to various parts of the fuel gauge IC 200.

The information from the EEPROM 214 is transferred to the register 221. The test terminal state set circuit 222 connects test ports 237 and 238 to the test control circuit 223 depending on the information held in the register 221, and sets inputs of the test control circuit 223 corresponding to the test ports 237 and 238 to a predetermined level.

When the inputs to the test ports 237 and 238 are supplied to the test control circuit 223, the test control circuit 223 varies the states of the internal circuits depending on the inputs, to thereby enable testing of the internal circuits of the fuel gauge IC 200.

An oscillator circuit 251, a crystal oscillator circuit 252, a selection control circuit 253, a frequency divider 254, a voltage sensor 255, a temperature sensor 256, a current sensor 257, a multiplexer (MPX) 258, and a delta-sigma modulator 259 are provided within the analog part 250.

The oscillator circuit 251 is formed by an oscillator having a PLL, and outputs an oscillation signal of several MHz. The crystal oscillator circuit 252 oscillates by having a quartz crystal unit externally connected to ports 271 and 272, and outputs an oscillation signal of several MHz. The oscillation frequency of the crystal oscillator circuit 252 has a high precision with respect to that of the oscillator circuit 251.

The selection control circuit 253 selects the oscillation frequency signal output from one of the oscillator circuit 251 and the crystal oscillator circuit 252, based on a selection signal supplied from a port 273, and supplies the selected oscillation frequency signal as the system clock to various parts of the fuel gauge IC 200, including the frequency divider 254. In addition, the selection control circuit 253 generates a reset signal RST and a control signal CNT. The selection control circuit 253 selects the oscillation frequency signal output from the oscillator circuit 251 when no selection signal is supplied from the port 273. The frequency divider 254 frequency-divides the system clock to generate various clocks, and supplies the various clocks to various parts of the fuel gauge IC 200.

The voltage sensor 255 detects the voltage of the batteries 301 and 302 that are externally connected to ports 274 and 275, respectively, and supplies the detected analog voltage to the multiplexer 258. The temperature sensor 256 detects an environment temperature of the fuel gauge IC 200, and supplies the detected analog temperature to the multiplexer 258.

Terminals of a current detecting resistor 303 are connected to ports 276 and 277. The current sensor 257 detects a current flowing through the current detecting resistor 303 from a potential difference between the ports 276 and 277, and supplies the detected analog current to the multiplexer 258.

The multiplexer 258 successively selects and supplies to the delta-sigma modulator 259 the detected analog voltage, the detected analog temperature, and the detected analog current. The delta-sigma modulator 259 performs a delta-sigma modulation on each analog value supplied thereto, and outputs a pulse density modulated signal. The pulse density modulated signal is supplied to the CPU 211 via the internal bus 400, and the CPU 211 performs a digital filtering process in order to digitize each of the detected voltage, the detected temperature, and the detected current. In addition, the CPU 211 totals the charge or discharge current of the battery, in order to compute the remaining battery capacity. The detected temperature is used for temperature compensation when computing the remaining battery capacity.

The fuel gauge IC 200 is accommodated within a housing 310 together with the batteries 301 and 302, the current detecting resistor 303, a resistor 305, and a switch 306, in order to form a battery pack 300. A positive electrode of the battery 301 and a power input terminal of a regulator and protection circuit 304 are connected to a terminal 311 of the battery pack 300, and a power output terminal of the regulator and protection circuit 304 is connected to the port 235 of the fuel gauge IC 200 for receiving the power supply voltage Vdd. A terminal 312 is connected to a ground terminal of the regulator and protection circuit 204 via the resistor 305. The terminal 312 is also connected via the switch 306 to a node connecting the current detecting resistor 303 and the port 277. The regulator and protection circuit 304 stabilizes a voltage between the terminals 311 and 312, and cuts off the switch 306 when this voltage falls outside a predetermined range for protection purposes.

In addition, A node connecting the current detecting resistor 303 and the port 276 is connected to a port 236 of the fuel gauge IC 200 for receiving a power supply voltage Vss. The ports 231 and 232 of the fuel gauge IC 200 are connected to terminals 313 and 314 of the battery pack 300.

This application is based upon and claims the benefit of priority of a Japanese Patent Application No. 2008-295743 filed on Nov. 19, 2008, in the Japanese Patent Office, the disclosure of which is hereby incorporated by reference.

Further, the present invention is not limited to these embodiments, but various variations and modifications may be made without departing from the scope of the present invention.

DESCRIPTION OF REFERENCE NUMERALS

10 Semiconductor Integrated Circuit Device
12, 14 Analog circuit region
12a, 14a Active Element Region
12b, 14b Capacitive Element Region
12c, 14c Resistive Element Region
13, 15 Digital Circuit Region
20 Semiconductor Substrate
21 Device Isolation Layer
22 First Level Metal Wiring Layer
23 Second Level Metal Wiring Layer
24 Insulator Layer
25 Polysilicon Wiring Layer
51, 52 Guard Band

The invention claimed is:

1. A semiconductor integrated circuit device comprising:
a semiconductor substrate;
a digital circuit formed on the semiconductor substrate;
an analog circuit formed on the semiconductor substrate,
wherein the analog circuit includes an active element, a resistor, and a capacitor,
wherein a surface of the semiconductor substrate is separated into a digital circuit region in which the digital circuit is formed, and an analog circuit region in which the analog circuit is formed,
wherein the analog circuit region is separated into an active element region in which the active element is formed, and a resistive and capacitive element region in which the resistor and the capacitor are formed; and
a guard band provided in a boundary between the active element region and the resistive and capacitive element region,
wherein the resistive and capacitive element region is arranged in a region adjacent to the digital circuit region,
wherein the active element region is arranged in a region separated from the digital circuit region,
wherein the resistive and capacitive element region is separated into a resistive element region in which the resistor is formed, and a capacitive element region in which the capacitor is formed; and
wherein the resistive element region and the capacitive element region are separated from each other in a plan view taken in a direction perpendicular to the surface of the semiconductor substrate.

2. The semiconductor integrated circuit device as claimed in claim 1, further comprising:
a second guard band provided in a boundary between the analog circuit region and the digital circuit region.

3. The semiconductor integrated circuit device as claimed in claim 1, wherein the resistive element region is arranged between the active element region and the digital circuit region, and the capacitive element region is arranged between the active element region and the digital circuit region.

4. A semiconductor integrated circuit device comprising:
a semiconductor substrate;
a digital circuit formed on the semiconductor substrate;
an analog circuit formed on the semiconductor substrate,
wherein the analog circuit includes an active element, a resistor, and a capacitor,
wherein a surface of the semiconductor substrate is separated into a digital circuit region in which the digital circuit is formed, and an analog circuit region in which the analog circuit is formed,
wherein the analog circuit region is separated into an active element region in which the active element is formed, and a resistive and capacitive element region in which the resistor and the capacitor are formed; and
a guard band provided in a boundary between the active element region and the resistive and capacitive element region,
wherein the resistive and capacitive element region is arranged in a region adjacent to the digital circuit region,
wherein the active element region is arranged in a region separated from the digital circuit region, and
wherein the capacitor is formed by two metal wiring layers separated from and opposing each other via an insulator layer on an element isolation layer in the resistive and capacitive element region.

5. A semiconductor integrated circuit device comprising:
a semiconductor substrate;
a digital circuit formed on the semiconductor substrate;
an analog circuit formed on the semiconductor substrate,
wherein the analog circuit includes an active element, a resistor, and a capacitor,
wherein a surface of the semiconductor substrate is separated into a digital circuit region in which the digital circuit is formed, and an analog circuit region in which the analog circuit is formed,
wherein the analog circuit region is separated into an active element region in which the active element is formed, and a resistive and capacitive element region in which the resistor and the capacitor are formed; and
a guard band provided in a boundary between the active element region and the resistive and capacitive element region,
wherein the resistive and capacitive element region is arranged in a region adjacent to the digital circuit region,
wherein the active element region is arranged in a region separated from the digital circuit region, and
wherein the resistor is formed by a polysilicon wiring layer provided on an element isolation layer in the resistive and capacitive element region.

* * * * *